United States Patent
Yang et al.

(10) Patent No.: US 7,007,263 B2
(45) Date of Patent: Feb. 28, 2006

(54) DESIGN FLOW METHOD FOR INTEGRATED CIRCUITS

(75) Inventors: Chun-Chih Yang, Taipei (TW); You-Ming Chiu, Yunghe (TW)

(73) Assignee: Via Technologies, Inc., Hsien Tien (TW)

( * ) Notice: Subject to any disclaimer, the term of this patent is extended or adjusted under 35 U.S.C. 154(b) by 385 days.

(21) Appl. No.: 10/342,281

(22) Filed: Jan. 15, 2003

(65) Prior Publication Data
US 2003/0188282 A1 Oct. 2, 2003

(30) Foreign Application Priority Data
Mar. 27, 2002 (TW) ............................... 91106061 A

(51) Int. Cl.
*G06F 17/50* (2006.01)
(52) U.S. Cl. .................. 716/18; 716/1; 716/6; 716/9
(58) Field of Classification Search ............... 716/1, 716/5, 6, 9, 12, 18, 16
See application file for complete search history.

(56) References Cited

U.S. PATENT DOCUMENTS 6,377,912 B1 * 4/2002 Sample et al. .............. 716/1
6,769,107 B1 * 7/2004 Watkins ..................... 716/16

* cited by examiner

*Primary Examiner*—Thuan Do
(74) *Attorney, Agent, or Firm*—Arent Fox PLLC

(57) ABSTRACT

The design flow method of the present invention accurately performs timing analysis during the circuit design stage, so that the DFT synthesis procedure can effectively control the timing information, preventing timing violation from happening during the IC design flow process. Furthermore, the information of the CTS procedure and the static-timing analysis procedure is combined to perform accurate timing estimation.

13 Claims, 5 Drawing Sheets

DESIGN FLOW METHOD FOR INTEGRATED CIRCUITS

BACKGROUND OF THE INVENTION

1. Field of Invention

The invention relates to a design flow method, and more particularly, to a circuit design flow method that generates DFT (Design For Test) scan chains for IC implementation.

2. Background of the Invention

The circuit system design of the very large-scale integrated circuit (VLSI) is usually achieved using components provided by a circuit module database. The flow of the IC design contains selecting correct modules and connecting related modules to provide needed functions. The processes for defining the modules are closely related to a database comprising standard cells. Even a small improvement can result in great help in lowering manufacturing costs and enhancing the effects.

Please refer to FIG. 1, which illustrates the links of a scan chain 101 in a circuit module 100. The circuit module 100 is part of a circuitry. In other words, a VLSI includes one or more circuit modules 100. There are functional connections among these modules to provide the circuit functions claimed in the specification. After the designer follows the specification and completes the functional design of the circuit system, the flow procedure often includes the generation of DFT (Design For Test) circuits, such as the test controller 107, for performing verification for the circuit module 100 in subsequent manufacturing processes.

The circuit module 100 includes an isolating scan chain 103 positioned at the boundary of the circuit module, one or more internal scan chains and control bit scan chains, e.g. scan chains 101, 102. These scan chains form isolation ring circuits. Test patterns are loaded from one or more of the scan-in terminals 104. The data in the circuits of the scan chains can be read through one or more than one scan-out terminal 105 to test whether the functions of the circuit module 100 are correct.

FIG. 2 illustrates a conventional IC design flow procedure. The flow contains the procedure to generate the scan chains for testing each circuit module.

To design a complete IC in a normal design flow, it is necessary to first accomplish the circuit design procedure 201 for the IC. This circuit design procedure includes a complete function description described by HDL (Hardware Description Language), e.g. the design description interfaces such as VHSIC (Very High Speed Integrated Circuit) or Verilog, is employed to present a function description for the circuit design. Such description includes the declaration of input and output signals, the internal structure and the behaviors of the circuit. After the circuit design procedure 201 is completed, a synthesis procedure 202 is started to convert the completed circuit modules into the actual gate levels. These gates may be such basic logic gates as AND, OR, and NOR gates, and they constitute the whole circuit. The synthesis procedure includes a DFT synthesis procedure for generating some cells in the circuit module and forming the scan chains. After the synthesis procedure 202 is completed, a pre-simulation procedure 203 is started before placement and routing. The pre-simulation procedure 203 is used to verify whether the designed circuit module and its scan chain timing have any error. If any error happens, the designer has to go back to the circuit design procedure 201 to modify the circuit module again. Such procedures have to be repeated until the timing of the circuit module passes the verification.

However, the pre-simulation procedure 203 takes the circuit component symbols of the converted actual gates and converts them into a circuit analysis simulation program. At this stage, the circuit analysis simulation program can only make a rough estimations for the timing because it does not contain the information of placement and routing. That is, the simulation does not contain the information of actual wire delay and cell delay. It only analyzes whether the circuit behaviors meet the functions of the specification.

After performing the pre-simulation procedure 203 and verifying that there is no error, a placement & routing procedure 204 is initiated. Once the placement & routing procedure 204 is completed, the information of the circuit module placement and the wire lengths inside the IC is fixed. At this moment, a program is used to check whether there is any mistake in the placement and routing. This is the post-simulation procedure 205. The simulation result of the post-simulation procedure 205 will be compared with the previous simulation result to see if they are consistent. If they are, then a manufacturing procedure 206 is performed; otherwise, one has to analyze such practical issues as wire delays or cell delays. The designer has to modify the circuit simulation analysis software or change the original functions of the circuit module. The placement & routing procedure 204 or the circuit design procedure 201 has to be done again until the final simulation results satisfy the specification. Apparently, this procedure waste too much time in going back and forth among different steps.

The conventional IC design process is tediously long. The purpose of inserting the DFT synthesis procedure into the synthesis procedure 202 is to test the IC products. Therefore, when the DFT synthesis procedure 202 is implemented before the placement & routing procedure 204 is carried, the generated scan chain does not take into account the information of circuit placement and routing. The results from the pre-simulation procedure 203 cannot accurately reflect the actual timing, but just a rough estimation. Consequently, the results from the post-simulation procedure 205 often have timing violation.

VLSI has to be tested to make sure that the chips do not contain fatal errors during the manufacture. The test process applies many test vectors for the VLSI and each test vector explicitly specifies the input signal for different input circuits. Suppose the circuit is in operation, the test controller makes a decision according to the output from the test circuit. As the circuit becomes complicated, the number of test vectors also increases in order to make comprehensive circuit tests. This inevitably makes the test processes too costly. Moreover, the market competition also imposes a limit on the time for a design engineer to finish the circuit design. Since the design time is forced to be shorter, the time that can be used for timing and function verification is also sacrificed. The above-mentioned factors form the bottleneck of the verification task. Therefore, the chip designers are pushed to find a new verification method to increase the efficiency.

When a chip is found to have a defect, it is still possible to fix the problem if the location of the error can be identified. For example, some chip designs use a long module connected to a bus to substitute a non-operating module that is connecting to the bus. It is of great value to find out the error during the production process by testing each module.

SUMMARY OF THE INVENTION

The object of the invention is to shorten the time to market for an IC product by improving the efficiency of IC design process.

Another object of the invention is to make the DFT synthesis procedure effectively control the timing information, preventing timing violation from happening during the IC design flow process.

Since the generation of scan chains in the conventional IC design flow process does not take into account the information after placement and routing, timing violation is likely to occur. The invention provides an IC design flow process, wherein the procedure for generating DFT (Design For Test) scan chains includes the information after placement and routing and more accurate timing analysis information. In the disclosed IC design flow process, an IC test is inserted after the placement and routing procedure and the timing analysis. Therefore, during the design flow process the scan chain generation already takes into account the information of placement and routing so that the pre-simulation is unlikely to have timing violation. Furthermore, the IC is ensured to contain no fatal manufacturing errors, increasing the maintainability and error detectability of the system.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
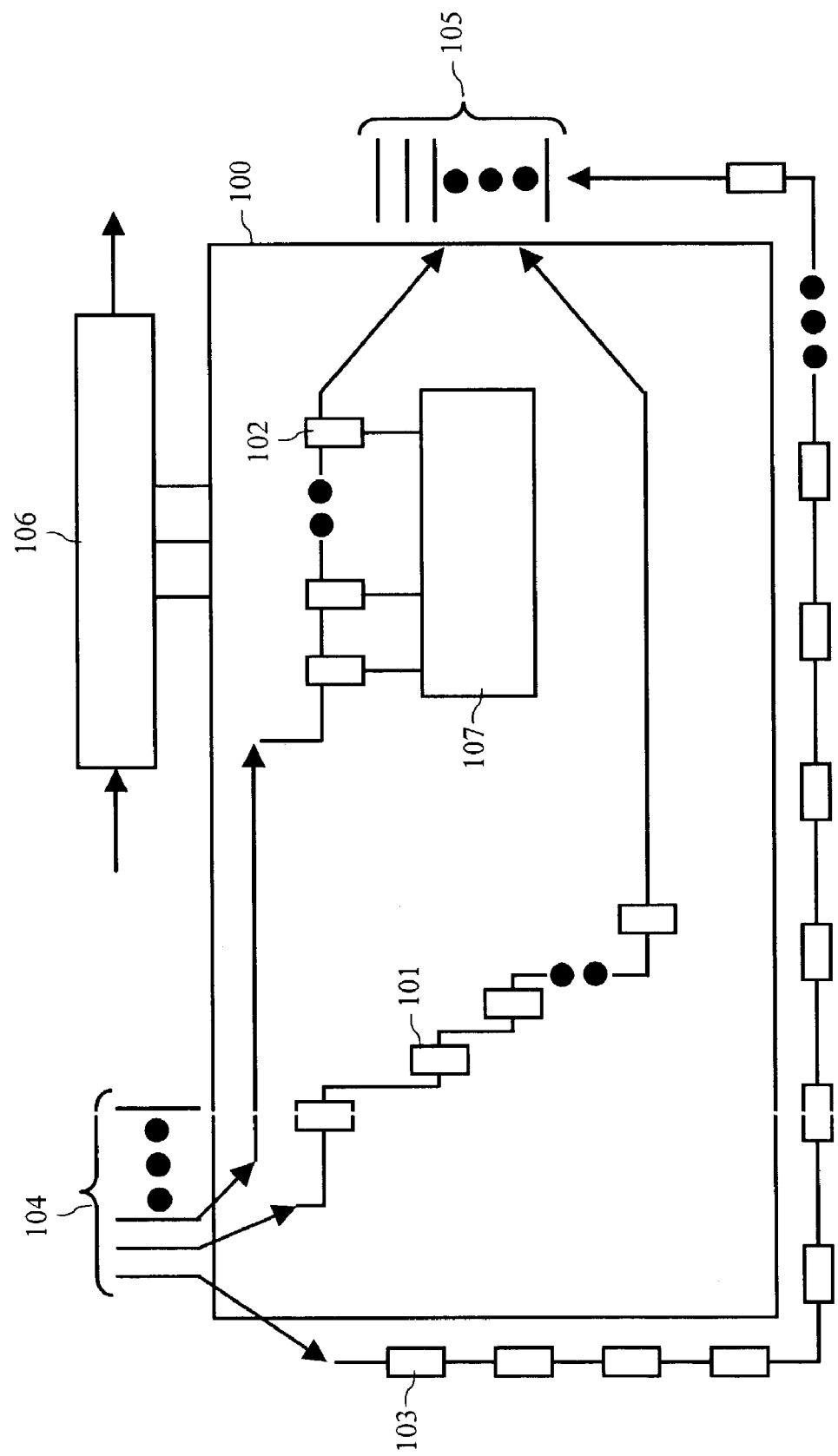
FIG. 1 is a schematic block diagram of scan chains in a circuit module.
Figure 2:
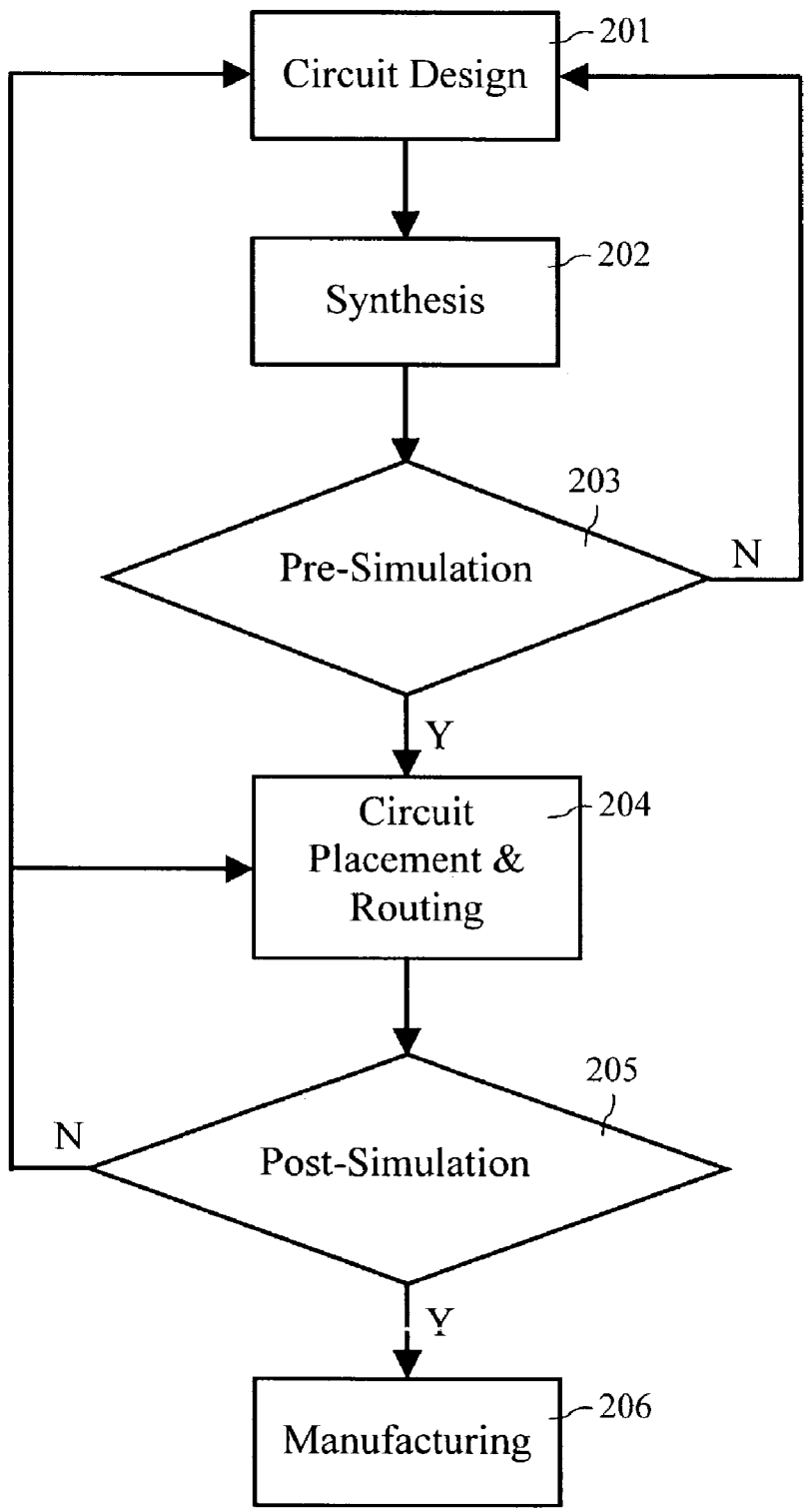
FIG. 2 is a conventional design flowchart for manufacturing an IC.
Figure 3:
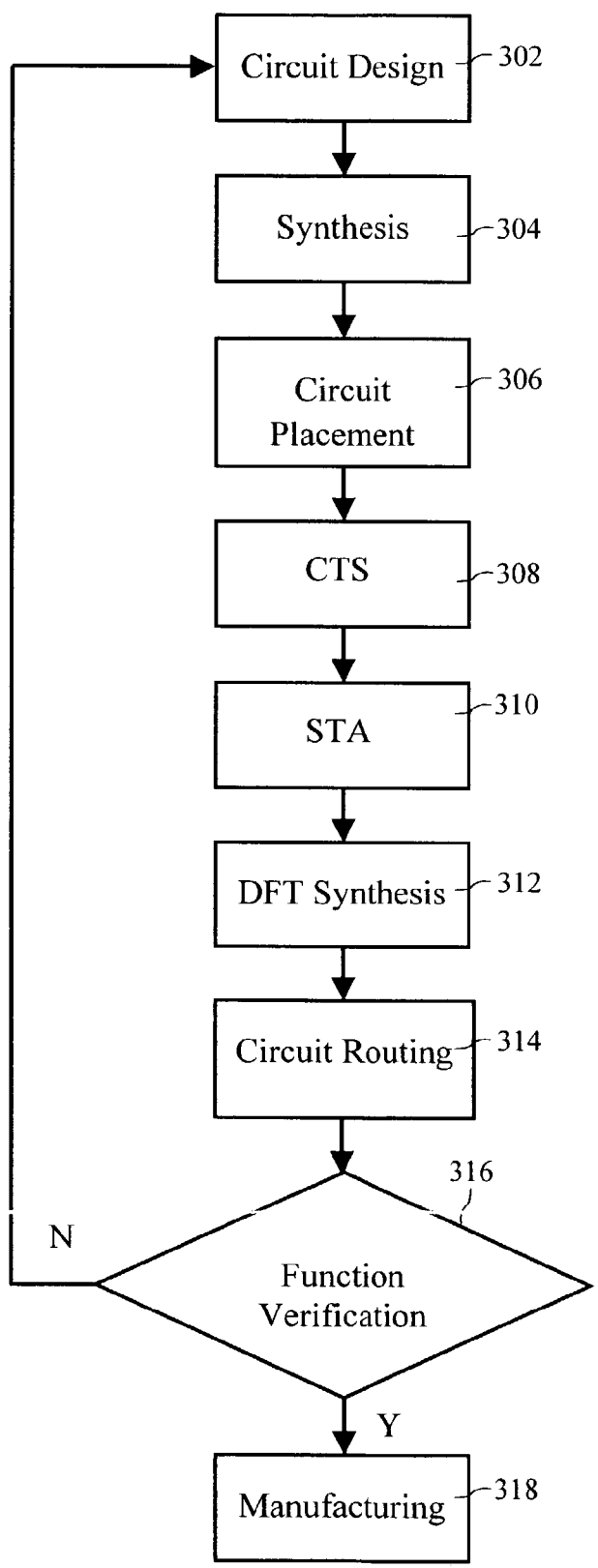
FIG. 3 is a flowchart of the disclosed IC design flow method in the present invention.

FIG. 3 shows a flowchart of the design flow method in the present invention, where certain procedures are the same as in FIGS. 1 and 2. The design flow method implemented on IC designs according to the present invention comprising the following procedures:

Step 302, Circuit Design Procedure:

This procedure generates the function description of circuit modules for the circuitry. In the IC design, a description programming language is used for the function description of the circuitry design in accordance with the specification. A complete description is made according to the desired circuit functions and the internal circuit structure. Each logic cell is converted into a component symbol in the actual circuit. These component symbols are further converted into a circuit analysis simulation program to ensure the design accuracy.

Step 304, Synthesis Procedure:

This procedure converts the designed circuit modules into the actual gate levels. However, the synthesis procedure does not contain a DFT synthesis.

Step 306, Circuit Placement Procedure:

This procedure performs logic gate component placement on circuit modules and generates the information and conditions about the positions of all components.

Step 308, Clock-Tree Synthesis (CTS) Procedure:

The CTS procedure 308 granted the condition of circuit placement prior to the DFT Synthesis procedure 312 (which shall be elaborated in later paragraphs). This procedure triggers the logic synthesis of the clock tree and the in-place optimization of same-function logic gates. It is ensured that the whole chip design after these procedures still keeps consistency in its functions at the logic gate level.

Step 310, Static-Timing Analysis (STA) Procedure:

This procedure can thoroughly check whether the system level chip design and the timing critical paths satisfy the timing requirement and whether the functions satisfy the requirements claimed in the specification. The STA procedure is a method for careful analyzing, debugging and verifying timing efficiency. The whole design area is divided into several timing paths. The time for each timing path is computed and checked according to different external timing assertions, making sure that no timing violation exists.

Step 312, DFT Synthesis Procedure:

This procedure generates a plurality of scan chains and executes a logic synthesis procedure in the circuit module, based upon the in-placement optimization information of the logic gates. After the circuit design procedure 302 and the circuit placement procedure 306, the result contains information of placement and rough estimations of actual wire lengths. The result is sent to the DFT synthesis procedure 312 to produce some cells inside the circuit module for generating scan chains and test controls. Some gate level synthesis data are produced after the synthesis procedure. These cells can be the basic logic gate cells such as the AND, OR, and XOR gates. These basic cells constitute the whole IC. Since this DFT synthesis procedure 312 is performed after the circuit placement procedure 306 is completed, the circuit analysis simulation program at this stage does not only have accurate timing estimation, but also the circuit placement and preliminary wire length information.

Step 314, Circuit Routing Procedure:

This procedure completes the final routing for the configured circuit module and obtains the actual wire lengths.

Step 316, Function Verification Simulation:

This procedure verifies the synthesis data containing scan chain information to see if they satisfy the circuit function specification. In accordance with the function description of the chip design, it performs an equivalent check and compares whether the circuit function requirements and the DFT synthesis procedure 312 are consistent in the estimation of the timing. If they are consistent, the chip is allowed for the subsequent manufacturing procedure 318. If they are not consistent, the designer has to reconsider the circuit design 302 with focus on wire delays or cell delays until the results are correct.

Step 318, Manufacturing Procedure:

Based upon the synthesis data that satisfy the function verification simulation, this procedure manufactures the IC of the circuitry. In the function verification simulation procedure 316, if the circuit function requirements and the DFT synthesis procedure 312 are consistent in the estimation of the timing, the IC chip is granted for subsequent manufacturing.

In the embodiment of the invention, the simulation analysis of the DFT synthesis procedure 312 already contains the information of circuit module placement and preliminary wire length estimations. Therefore, the timing estimation is more accurate and timing violation is less likely to happen in the results after the chip manufacturing procedure 318.

Figure 4:
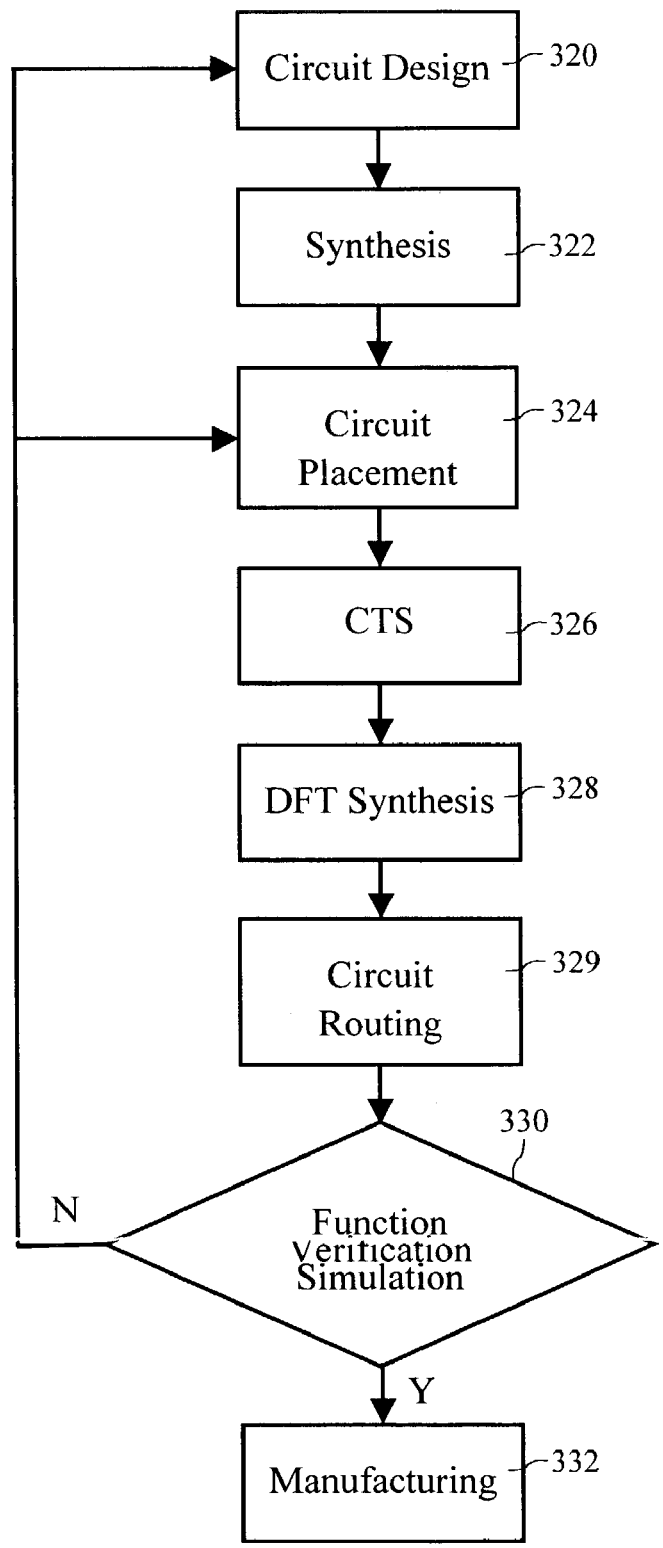
FIG. 4 is a flowchart of another embodiment of the disclosed IC design flow method.

Please refer to FIG. 4, which is the flowchart of another preferred embodiment of the present invention. In this embodiment, the circuit design procedure 320 is followed by a synthesis procedure 322 that converts the circuit module into the actual gate level. This synthesis procedure 322 does not include the DFT synthesis procedure 328. Afterwards, the circuit placement procedure 324 is performed to produce information and conditions among different cells. A CTS procedure 326 grants the circuit placement conditions prior to the DFT synthesis procedure 328. In this step, the CTS procedure 326 performs logic synthesis of the clock tree and in-place optimization of the same function logic gate placement. This ensures that the chip design still maintains its function consistency at the logic gate level after these procedures. The DFT synthesis procedure 328 then follows the information obtained from the previous procedures to generate a plurality of scan chains in the circuit module. Finally, the circuit routing procedure 329 and the function verification simulation procedure 330 are performed. If the chip passes the function verification simulation procedure 330, the flow enters the manufacturing procedure 332. If the chip does not pass the function verification simulation procedure 330, the designer has to return to the circuit design procedure 320 or the circuit placement procedure 324 to make appropriate modifications.

Figure 5:
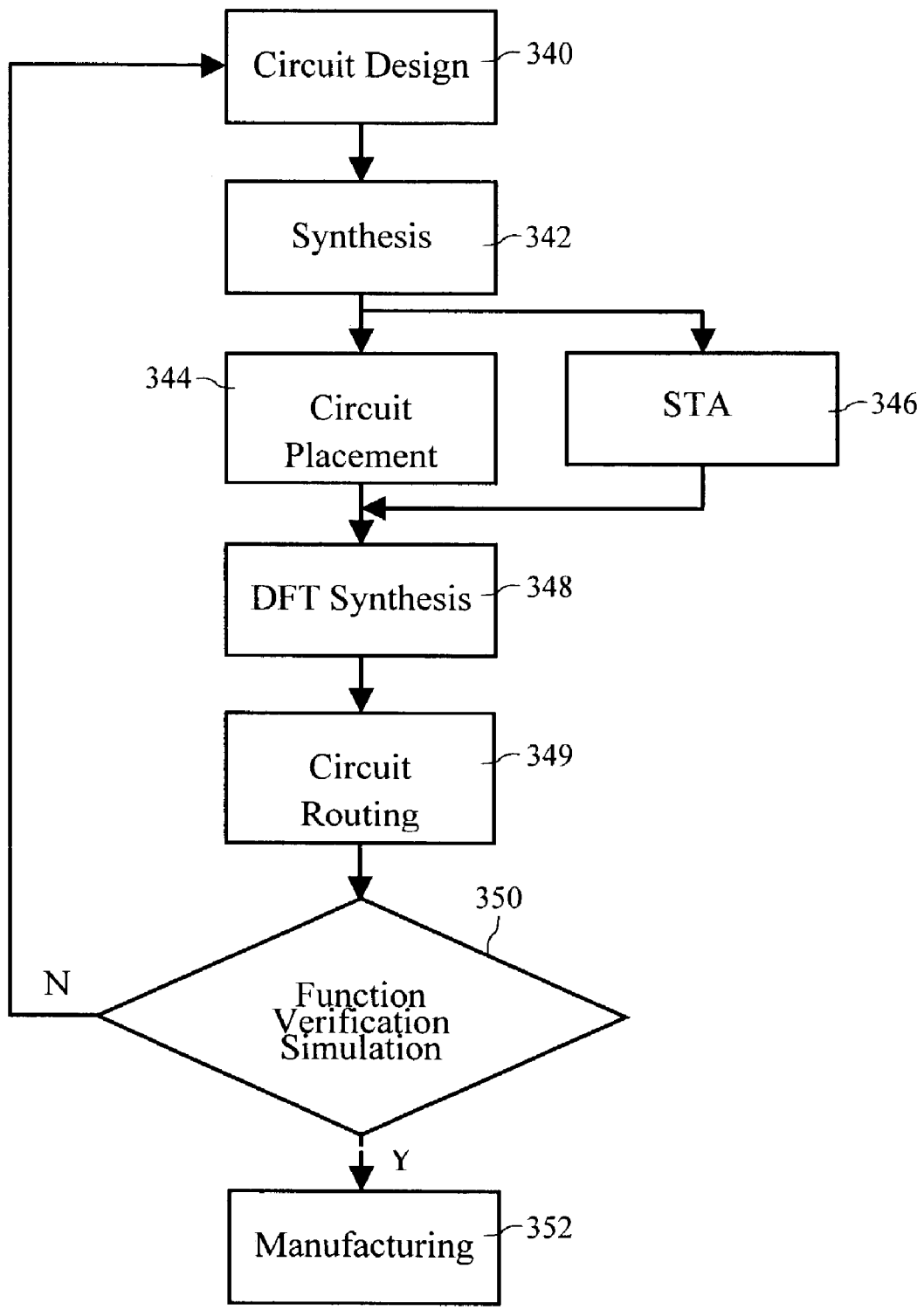
FIG. 5 is a flowchart of another embodiment of the disclosed IC design flow method.

With reference to FIG. 5, the circuit design procedure 340 is followed by a synthesis procedure 342 that converts the circuit module into the actual gate levels. This synthesis procedure 342 does not include the DFT synthesis procedure 348. Afterwards, the circuit placement procedure 344 and the STA procedure 346 are simultaneously performed to produce information and conditions among different cells. At the same time, the gate level chip design and the critical timing path can be thoroughly verified, checking whether the specified functions are achieved. The DFT synthesis procedure 348 then follows the information obtained from the previous procedures to generate a plurality of scan chains in the circuit module. Finally, the circuit routing procedure 349 and the function verification simulation procedure 350 are performed. If the chip passes the function verification simulation procedure 350, the flow enters the manufacturing procedure 352. If the chip does not pass the function verification simulation procedure 350, the designer has to return to the circuit design procedure 340 make appropriate modifications.

The disclosed IC design flow method utilizes the information obtained before the DFT synthesis procedure and then uses the DFT synthesis procedure to generate some cells to form scan chains in the circuit module. Since the circuit placement and routing result are given information during the design flow process, the timing estimation is more accurate. With the help of the information generated by the STA procedure and the CTS procedures, it is more convenient to control the timing information in the DFT synthesis procedure.

Effects of the Invention

The IC design flow method of the invention has many advantages and features. For example, the disclosed method can greatly shorten the time to market for a new IC product by improving the efficiency of the IC design flow.

Another advantage of the invention is that the timing analysis can be accurately performed during the IC chip design process. That is, the DFT synthesis procedure can effectively control the timing information to avoid the possibilities of timing violation. In this way, the design engineer can obtain data that are more reliable for timing verification and/or improving the design.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A design flow method for designing an integrated circuit of a circuitry, comprising the following steps:
   a) converting the function description of a circuit module into a plurality of logic gate cells;
   b) configuring the placement of the logic gate cells;
   c) performing a Clock-Tree Synthesis (CTS) procedure;
   d) performing a Static-Timing Analysis (STA) procedure for verifying any timing violation situations;
   e) generating a plurality of scan chains and generating logic synthesis data; and
   f) performing the routing of the logic gate cells.

2. The design flow method of claim 1, wherein said function description is presented by a Hardware Description Language (HDL).

3. The design flow method of claim 1, wherein said generating scan chains of said step e) refers to the wire length information.

4. The design flow method of claim 3, wherein said generating scan chains of said step e) refers to the information of the CTS and wire lengths.

5. The design flow method of claim 1, wherein said generating scan chains of said step e) refers to the STA, CTS and wire length information.

6. A design flow method for designing an integrated circuit of a circuitry, comprising the following steps:
   a) converting the function description of a circuit module into a plurality of logic gate cells;
   b) configuring the placement of the logic gate cells;
   c) performing a Clock-Tree Synthesis (CTS) procedure;
   d) generating a plurality of scan chains and generating logic synthesis data; and
   e) performing the routing of the logic gate cells.

7. The design flow method of claim 6, wherein said function description is presented by a Hardware Description Language (HDL).

8. The design flow method of claim 6, wherein said generating scan chains of said step d) refers to the wire length information.

9. The design flow method of claim 8, wherein said generating scan chains of said step e) refers to the CTS and wire length information.

10. A design flow method for designing an integrated circuit of a circuitry, comprising the steps of:
    a) converting the function description of a circuit module into a plurality of logic gate cells;
    b) configuring the placement of the logic gate cells and performing a Clock-Tree Synthesis (CTS) procedure at the same time;
    c) generating a plurality of scan chains and generating logic synthesis data; and
    d) performing the routing of the logic gate cells.

11. The design flow method of claim 10, wherein said function description is presented by a Hardware Description Language (HDL).

12. The design flow method of claim 10, wherein said generating scan chains of said step c) refers to the wire length information.

13. The design flow method of claim 12, wherein said generating scan chains of said step c) refers to the CTS and wire length information.

* * * * *